United States Patent
Hsieh

(10) Patent No.: US 7,589,970 B2
(45) Date of Patent: Sep. 15, 2009

(54) ASSEMBLED STRUCTURE OF POWER SEMICONDUCTOR DEVICE AND HEAT SINK

(75) Inventor: Hung-Chang Hsieh, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/627,089

(22) Filed: Jan. 25, 2007

(65) Prior Publication Data

US 2008/0080140 A1    Apr. 3, 2008

(30) Foreign Application Priority Data

Sep. 29, 2006    (TW) .............................. 95136415 A

(51) Int. Cl.
*H05K 7/20* (2006.01)
*H01L 23/36* (2006.01)

(52) U.S. Cl. .................. 361/707; 361/704; 361/709; 165/80.3; 165/104.33

(58) Field of Classification Search ................ 361/704, 361/709–710, 713, 717–719; 165/104.33, 165/185; 174/16.3; 257/706–707, 709, 712–713, 257/717; 411/372.5–373
See application file for complete search history.

(56) References Cited

U.S. PATENT DOCUMENTS

| | | | | | |
|---|---|---|---|---|---|
| 3,238,425 A | * | 3/1966 | Geyer | ......................... | 257/689 |
| 3,369,597 A | * | 2/1968 | Dronsuth et al. | ........... | 165/80.3 |
| 3,763,402 A | * | 10/1973 | Shore et al. | ................. | 257/722 |
| 3,801,874 A | * | 4/1974 | Stefani | ........................ | 361/709 |
| 4,214,505 A | * | 7/1980 | Aimar | ........................ | 411/373 |
| 4,266,267 A | * | 5/1981 | Ruegg | ........................ | 361/717 |
| 4,460,917 A | * | 7/1984 | Rogers | ....................... | 257/717 |
| 4,546,408 A | * | 10/1985 | Rodseth et al. | ............. | 361/720 |
| 4,587,377 A | * | 5/1986 | Rodseth | ..................... | 174/16.3 |
| 4,642,671 A | * | 2/1987 | Rohsler et al. | .............. | 257/712 |
| 4,646,203 A | * | 2/1987 | Ngo et al. | .................... | 361/708 |
| 4,753,405 A | * | 6/1988 | Camilleri | .................... | 248/235 |
| 4,907,124 A | * | 3/1990 | Kaufman | .................... | 361/722 |
| 5,103,538 A | * | 4/1992 | Ryder | .......................... | 24/662 |
| 5,653,564 A | * | 8/1997 | Nakamura | .................. | 411/373 |
| D386,068 S | * | 11/1997 | Nakamura | .................. | D8/387 |
| 6,740,968 B2 | * | 5/2004 | Matsukura et al. | .......... | 257/707 |

(Continued)

FOREIGN PATENT DOCUMENTS

DE    3019272 A1  *  11/1981

(Continued)

*Primary Examiner*—Michael V Datskovskiy
(74) *Attorney, Agent, or Firm*—Kirton & McConkie; Evan R. Witt

(57) ABSTRACT

An assembled structure includes a power semiconductor device, a first insulating member, a heat sink and a fastening element. The power semiconductor device has a first perforation. The first insulating member includes a first opening and a second opening corresponding to the first perforation and a receiving portion between the first opening and a second opening. The fastening element includes a head portion and a body portion. The body portion is penetrated through the first opening, the receiving portion, the second opening and the first perforation such that the power semiconductor device is fastened onto the heat sink. The head portion is received in the receiving portion so as to isolate the head portion of the fastening element from adjacent electronic components.

15 Claims, 9 Drawing Sheets

U.S. PATENT DOCUMENTS

| | | | |
|---|---|---|---|
| 6,830,012 B1 * | 12/2004 | Swan | 119/720 |
| 6,835,038 B2 * | 12/2004 | Benito-Navazo | 411/80.1 |
| 7,056,132 B1 * | 6/2006 | Berglund et al. | 439/76.1 |
| 2002/0134575 A1 * | 9/2002 | Tong | 174/138 G |
| 2005/0100425 A1 * | 5/2005 | Wu | 411/372.5 |
| 2006/0121703 A1 * | 6/2006 | Huang | 438/487 |

FOREIGN PATENT DOCUMENTS

| | | | |
|---|---|---|---|
| FR | 2558645 A | * | 7/1985 |
| JP | 06330922 A | * | 11/1994 |
| JP | 407153583 A | * | 6/1995 |
| JP | 2004356596 A | * | 12/2004 |

* cited by examiner

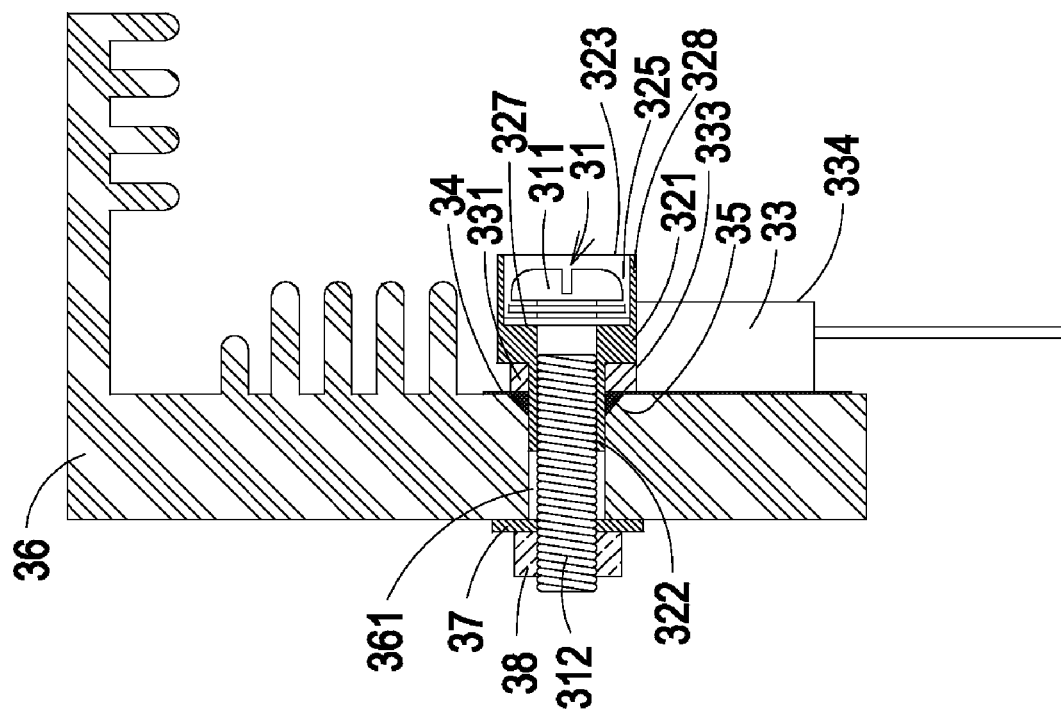

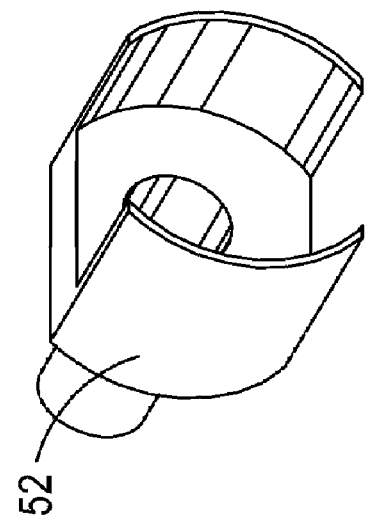
Fig. 5(c)
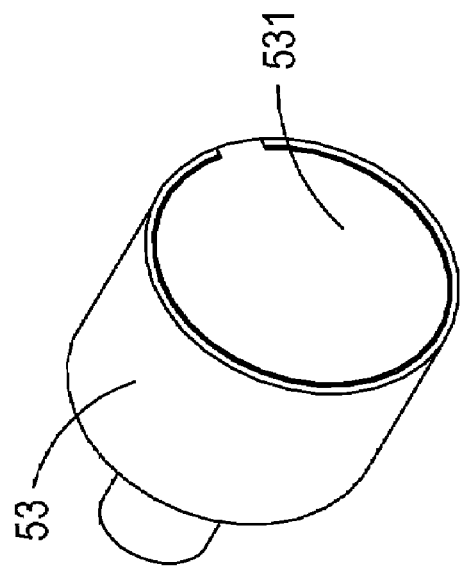
Fig. 5(e)
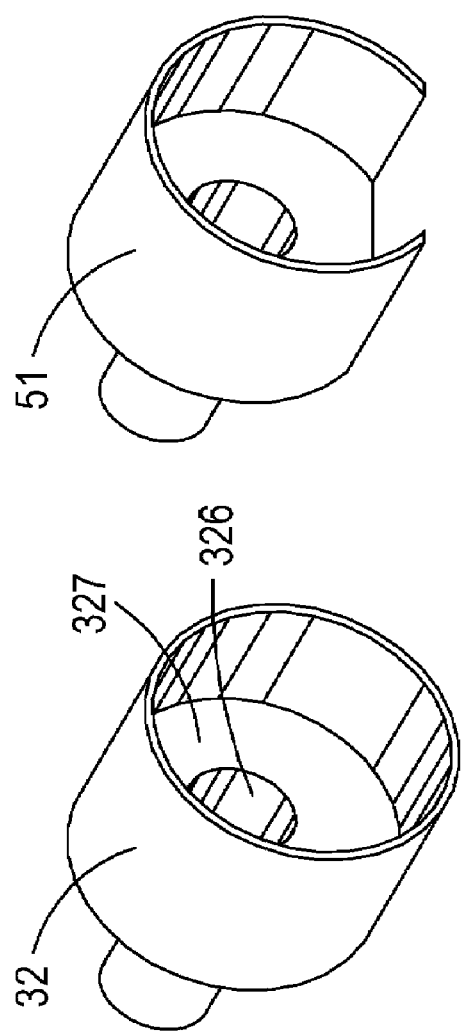
Fig. 5(b)
Fig. 5(a)
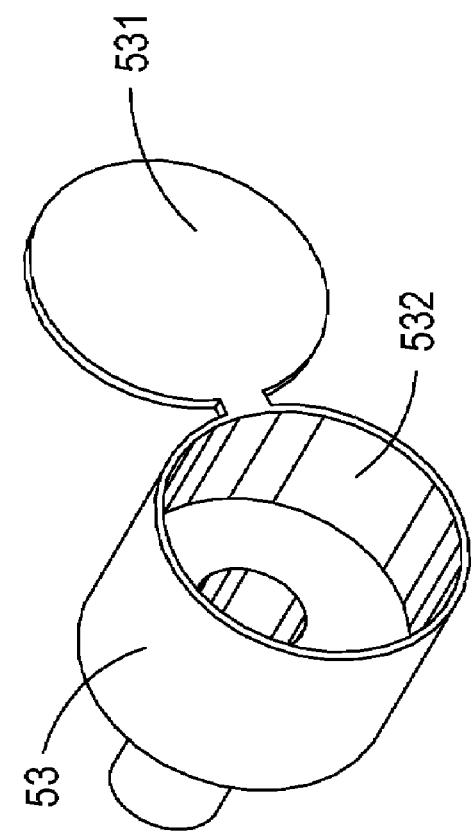
Fig. 5(d)

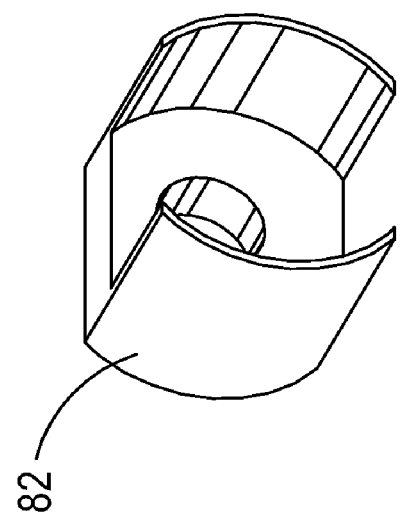
Fig. 8(b)
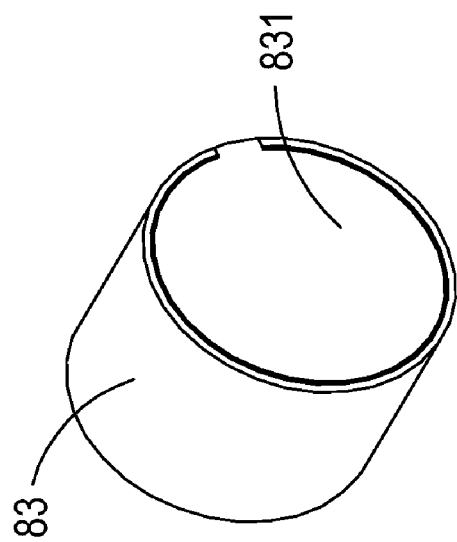
Fig. 8(c)
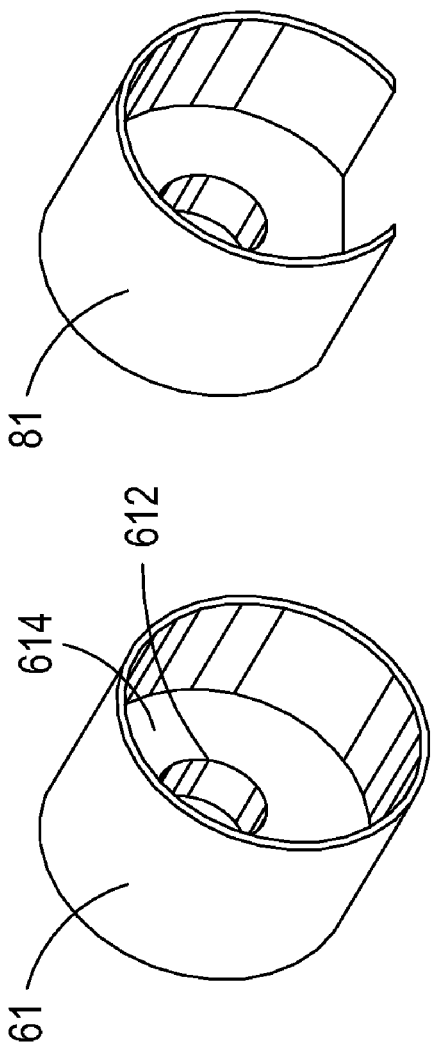
Fig. 8(a)
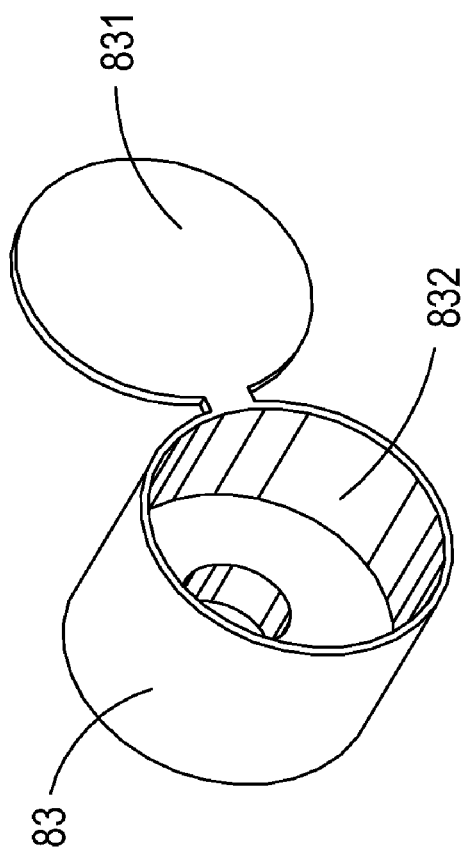
Fig. 8(e)
Fig. 8(d)

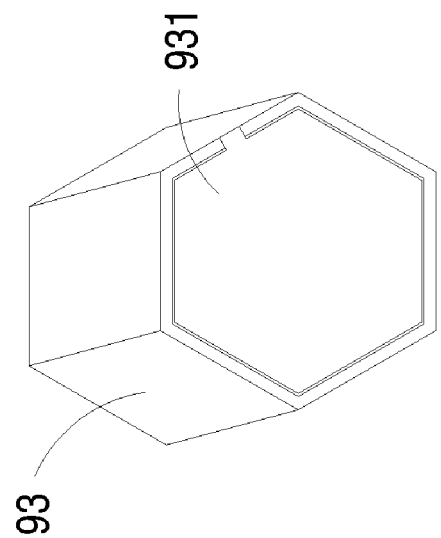
Fig. 9(c)
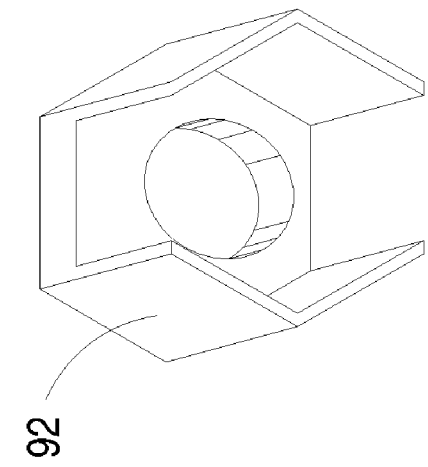
Fig. 9(b)
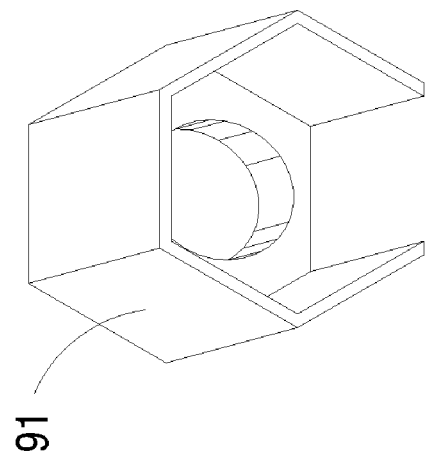
Fig. 9(a)
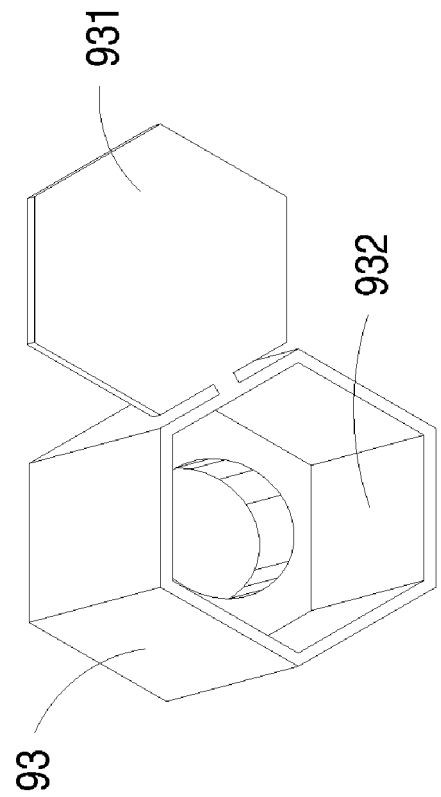
Fig. 9(e)
Fig. 9(d)
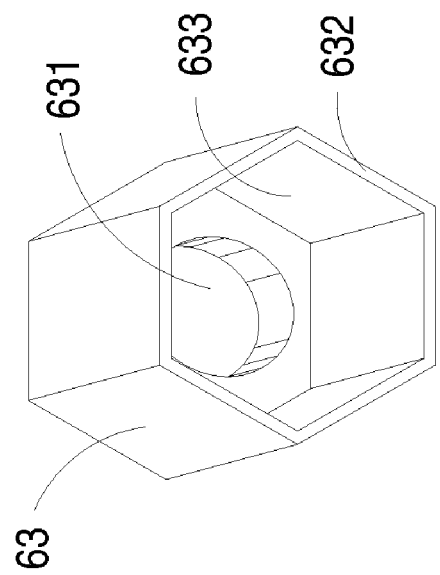

ASSEMBLED STRUCTURE OF POWER SEMICONDUCTOR DEVICE AND HEAT SINK

FIELD OF THE INVENTION

The present invention relates to an assembled structure of a power semiconductor device and a heat sink, and more particularly to an assembled structure of a power semiconductor device and a heat sink by fastening a power semiconductor device onto a heat sink.

BACKGROUND OF THE INVENTION

With the rapid progress of semiconductor industries, the integrated circuits (ICs) used in electronic apparatuses are developed toward minimization, high operating speed and increasing integration level. Due to the reduced size and the increased performance, power semiconductor devices such as power transistors have achieved a great deal of advance. The power transistors are widely used in many electronic apparatuses such as control equipment, measuring equipment, electrical apparatuses and computer peripheral devices because they are very suitable to process high-power signals. During operation of the electronic apparatus, the power transistors may generate energy in the form of heat, which is readily accumulated and difficult to dissipate away. If no proper heat-dissipating mechanism is provided to transfer enough heat to the ambient air, the elevated operating temperature may result in damage of the electronic components, a breakdown of the whole electronic apparatus or reduced operation efficiency. Therefore, it is important to dissipate the heat generated from the power transistors in order to stabilize the operation and extend the operational life of the electronic apparatus.

Typically, the power transistors are fastened onto a surface of a heat sink in order to increase heat-dissipating efficiency. FIG. 1 is a schematic exploded view illustrating a power transistor to be fastened onto a heat sink. FIG. 2 is a schematic cross-sectional view illustrating the assembled structure of the power transistor and the heat sink. By means of a screw 11, a washer 17 and a nut 18, a power transistor 13 is fastened onto a heat sink 16. By means of a plastic bushing 12, an insulating piece 14 and an isolating piece 15, the metallic portion 131 of the power transistor 13 is separated from the screw 11 and the heat sink 16 in order to prevent spark generation and short-circuit breakdown.

Since electronic apparatuses are developed toward minimization, high-density mounting is needed. After the power transistor 13 is fastened onto the heat sink 16, the head portion 111 of the screw 11 is not covered by the plastic bushing 12 and exposed outsides. If the electronic apparatus is suffered from a drop or a strong impact, the head portion 111 of the screw 11 is possibly in contact with adjacent electronic components. In this circumstance, the electronic apparatus will be short-circuited or even damaged.

For solving the above problem, an insulating piece is manually placed in the vicinity of the screw 11 to isolate the screw 11 from other electronic components. Since the insulating piece is not suitably positioned, the insulating piece is readily detached from the original position if the electronic apparatus is suffered from a drop or a strong impact. That is, the head portion 111 of the screw 11 may be still in contact with adjacent electronic components. In addition, manually positioning the insulating piece is labor-intensive and time-consuming.

In views of the above-described disadvantages resulted from the prior art, the applicant keeps on carving unflaggingly to develop an assembled structure of a power semiconductor device and a heat sink according to the present invention through wholehearted experience and research.

SUMMARY OF THE INVENTION

It is an object of the present invention to provide an assembled structure of a power semiconductor device and a heat sink by placing the head portion of the fastening element within a receiving portion of an insulating member so as to isolate said head portion of said fastening element from adjacent electronic components.

In accordance with an aspect of the present invention, there is provided an assembled structure of a power semiconductor device and a heat sink. The assembled structure includes a power semiconductor device, a first insulating member, a heat sink and a fastening element. The power semiconductor device has a first perforation, a first side and a second side adjacent to the first side. The first insulating member includes a first opening and a second opening corresponding to the first perforation and a sidewall defining a receiving portion between the first opening and the second opening. The receiving portion includes an inner bottom surface, and the sidewall of the first insulating member is substantially in contact with the first side of the power semiconductor device and protruded relative to the second side of the power semiconductor device. The fastening element includes a head portion and a body portion. The distance from the first opening to the inner bottom surface of the receiving portion of the first insulating member is substantially not less than the height of the head portion of the fastening element. The body portion is penetrated through the first opening, the receiving portion, the second opening and the first perforation such that the power semiconductor device is fastened onto the heat sink. The head portion is received in the receiving portion so as to isolate the head portion of the fastening element from adjacent electronic components.

Preferably, the fastening element is a screw.

In an embodiment, the fastening element further includes a nut to be engaged with the body portion of the screw such that the power semiconductor device is fastened onto the heat sink.

In an embodiment, the first part of the heat sink is supported on the first surface of the circuit board, and the second part of the heat sink is substantially parallel with the circuit board such that a space is formed between the second part of the heat sink and the circuit board.

In an embodiment, an insulating piece is arranged between the power semiconductor device and the heat sink for isolating the power semiconductor device from the heat sink, wherein the insulating piece includes a second perforation corresponding to the first perforation of the power semiconductor device.

In an embodiment, the heat sink has a through-hole corresponding to the second perforation of the insulating piece and the body portion of the screw is penetrated through the through-hole.

In an embodiment, a second insulating member is arranged between the nut and the heat sink for isolating the heat sink from the nut.

Preferably, the power semiconductor device is a power transistor.

In an embodiment, the power semiconductor device includes an encapsulant resin.

In an embodiment, the first insulating member is a sleeve including the first opening and the second opening, and the diameter of the first opening is larger than that of the second opening.

In an embodiment, the second insulating member include a third opening and a fourth opening corresponding to the heat sink and the nut, respectively, and the diameter of the third opening is smaller than that of the fourth opening.

In an embodiment, the second insulating member further includes a receptacle between the third opening and the fourth opening. The body portion of the screw is successively penetrated through the first opening, the receiving portion and the second opening of the first insulating member, the first perforation of the power semiconductor device, the second perforation of the insulating piece, the through-hole of the heat sink and the third opening of the second insulating member. The body portion of the screw is screwed in the nut, wherein the nut is accommodated within the receptacle of the second insulating member so as to isolate the nut from adjacent electronic components.

In an embodiment, the power semiconductor device includes a metallic plate.

In an embodiment, the first insulating member includes a first sleeve and a second sleeve communicated with each other, the first sleeve includes the first opening and the receiving portion, the second sleeve includes the second opening and a channel, the channel is communicated with the receiving portion and the second opening, and the diameter of the first opening is larger than that of the second opening.

In an embodiment, the second sleeve of the first insulating member is received in the first perforation of the power semiconductor device, the second perforation of the insulating piece and the through-hole of the heat sink such that the body portion of the screw is isolated from the power semiconductor device and the heat sink.

In an embodiment, the second insulating member include a third opening and a fourth opening corresponding to the heat sink and the nut, respectively, and the diameter of the third opening is smaller than that of the fourth opening.

In an embodiment, the second insulating member further include a receptacle between the third opening and the fourth opening. The body portion of the screw is successively penetrated through the first opening, the receiving portion, the channel and the second opening of the first insulating member, the first perforation of the power semiconductor device, the second perforation of the insulating piece, the through-hole of the heat sink and the third opening of the second insulating member. The body portion of the screw is screwed in the nut, wherein the nut is accommodated within the receptacle of the second insulating member so as to isolate the nut from adjacent electronic components.

The above contents of the present invention will become more readily apparent to those ordinarily skilled in the art after reviewing the following detailed description and accompanying drawings, in which:

BRIEF DESCRIPTION OF THE DRAWINGS

FIG. 4 is a schematic cross-sectional view illustrating the assembled structure of the power transistor and the heat sink shown in FIG. 3;

FIGS. 5(a)~5(e) schematically illustrate some examples of the first insulating member;

FIGS. 8(a)~8(e) schematically illustrate some examples of the first insulating member; and FIGS. 9(a)~9(e) schematically illustrate some examples of the second insulating member.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides an assembled structure of a power semiconductor device and a heat sink. The present invention will be illustrated by referring to a power transistor. Nevertheless, the present invention can be applied to other power semiconductor devices.

Figure 1:
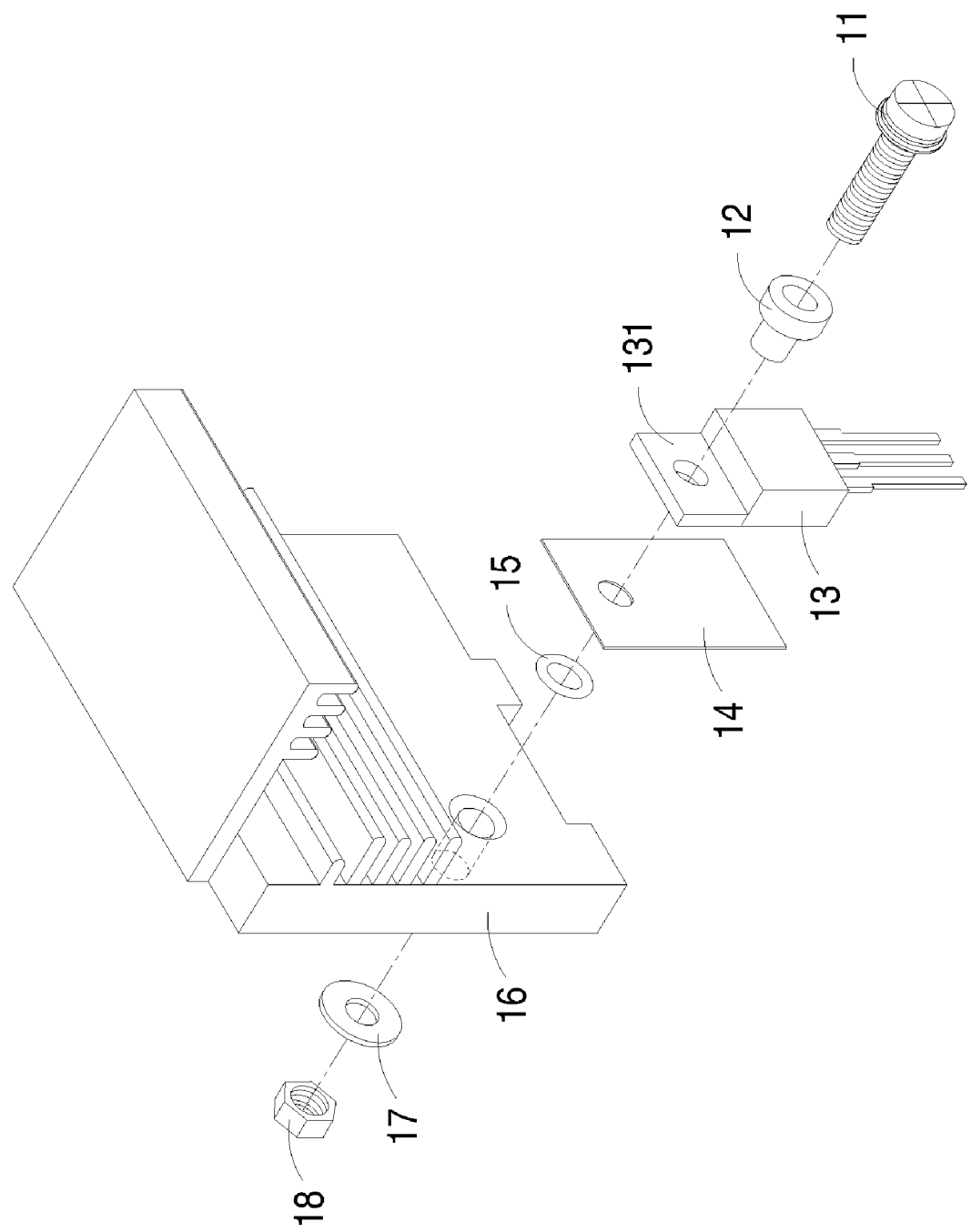
FIG. 1 is a schematic exploded view illustrating a power transistor to be fastened onto a heat sink.
Figure 2:
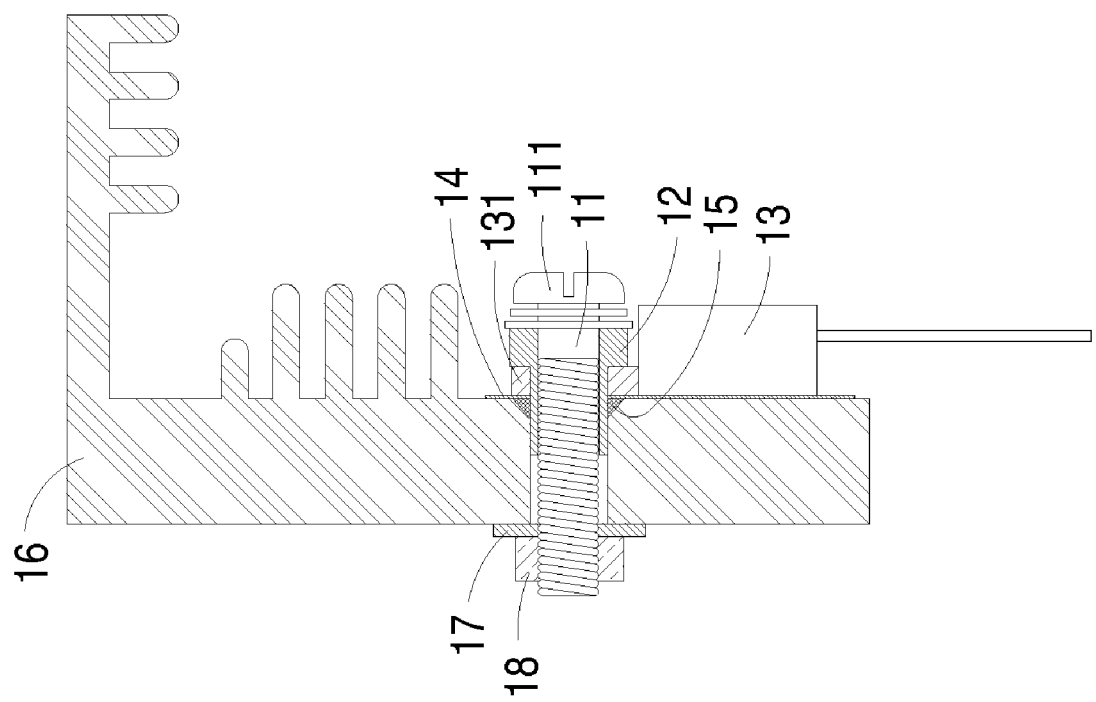
FIG. 2 is a schematic cross-sectional view illustrating the assembled structure of the power transistor and the heat sink shown in FIG. 1.
Figure 3:
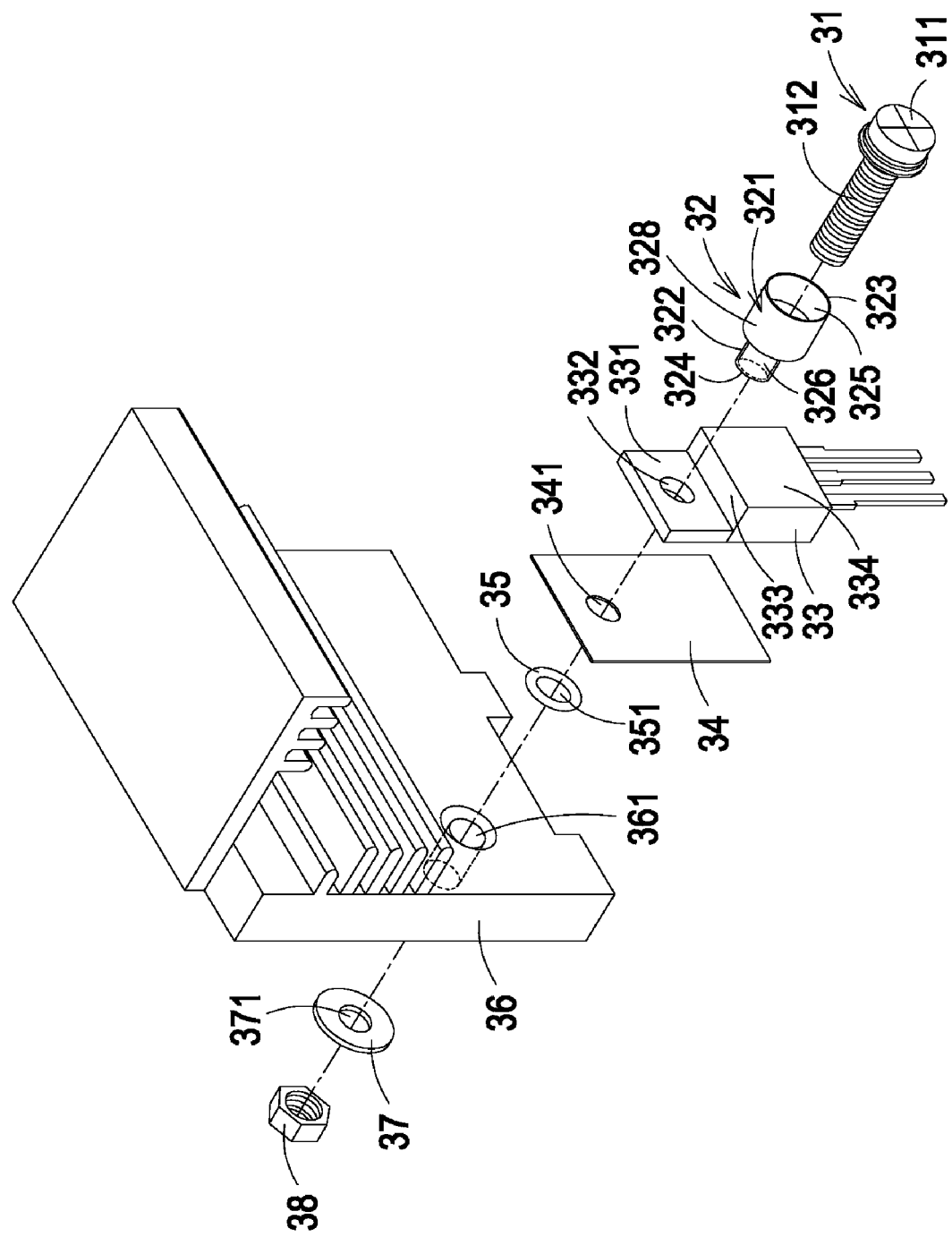
FIG. 3 is a schematic exploded view illustrating a power transistor to be fastened onto a heat sink according to a first preferred embodiment of the present invention.

FIG. 3 is a schematic exploded view illustrating a power transistor to be fastened onto a heat sink according to a first preferred embodiment of the present invention. FIG. 4 is a schematic cross-sectional view illustrating the assembled structure of the power transistor and the heat sink. The assembled structure includes a fastening element, a first insulating member 32, a power transistor 33, an insulating piece 34 and a heat sink 36. The fastening element includes a combination of a screw 31 and a nut 38. The screw 31 includes a head portion 311 and a body portion 312. The screw 31 and a nut 38 are arranged on opposite sides of the heat sink 36.

The power transistor 33 has a metallic plate 331. The heat generated from the power transistor 33 may be transferred from the metallic plate 331 to the heat sink 36 and dissipated away so as to reduce the working temperature of the power transistor 33. The metallic plate 331 has a first perforation 332 therein. The power transistor 33 further comprises a first side 333 and a second side 334 adjacent to the first side 333. The first insulating member 32 includes a first sleeve 321 and a second sleeve 322, which are communicated with each other. The first sleeve 321 includes a first opening 323 and a sidewall 328 defining a receiving portion 325, wherein the receiving portion 325 includes an inner bottom surface 327. The second sleeve 322 includes a second opening 324 and a channel 326. The channel 326 is communicated with the receiving portion 325 and the second opening 324. The diameter of the first opening 323 is larger than that of the second opening 324. After the screw 31 is inserted into the first insulating member 32, the body portion 312 of the screw 31 is partially penetrated through the second opening 324 and partially received in the channel 326. The head portion 311 of the screw 31 is received in the receiving portion 325 of the first sleeve 321.

The insulating piece 34 is arranged between the power transistor 33 and the heat sink 36 for isolating the power transistor 33 from the heat sink 36. The insulating piece 34 includes a second perforation 341 corresponding to the first perforation 332. The heat sink 36 is fixed on a circuit board (not shown) and includes a through-hole 361. An insulating bushing 35 is arranged between the heat sink 36 and the insulating piece 34. A second insulating member 37, e.g. a washer, is arranged between the heat sink 36 and the nut 38. The insulating bushing 35 and the washer 37 are disposed on opposite sides of the heat sink 36. The insulating bushing 35 and the washer 37 include a third perforation 351 and a fourth perforation 371 corresponding to the through-hole 361 of the heat sink 36.

The process of fastening the power transistor 33 onto the heat sink 36 will be illustrated as follows. First of all, the body portion 312 of the screw 31 is successively penetrated through the first opening 323 and the receiving portion 325 of the first sleeve 321, the channel 326 and the second opening 324 of the second sleeve 322 of the first insulating member 32, the first perforation 332 of the metallic plate 331 of the power transistor 33, the second perforation 341 of the insulating piece 34, the third perforation 351 of the insulating bushing 35, the through-hole 361 of the heat sink 36 and the fourth perforation 371 of the washer 37. Then, the body portion 312 of the screw 31 is screwed in the nut 38 such that the power transistor 33 is fastened onto the heat sink 36.

Please refer to FIG. 4 again. After the screw 31 is combined with the nut 38, the head portion 311 of the screw 31 is received in the receiving portion 325 of the first sleeve 321 so that the screw 31 is isolated from the adjacent electronic components, and the sidewall 328 of the first insulating member 32 is substantially in contact with the first side 333 of the power transistor 33 and protruded relative to the second side 334 of the power transistor 33. Meanwhile, the second sleeve 322 of the first insulating member 32 is received in the first perforation 332 of the power transistor 33, the second perforation 341 of the insulating piece 34, the third perforation 351 of the insulating bushing 35, the through-hole 361 of the heat sink 36 such that the body portion 312 of the screw 31 is isolated from the metallic plate 331 of the power transistor 33 and the heat sink 36. In addition, the insulating piece 34 and the insulating bushing 35 are arranged between the power transistor 33 and the heat sink 36 so as to isolate the power transistor 33 from the heat sink 36. Likewise, the washer 37 is effective to isolate the nut 38 from the heat sink 36.

Referring to FIG. 5(*a*), a schematic enlarged view of the first insulating member 32 shown in FIGS. 3 and 4 is illustrated. It is noted that, however, those skilled in the art will readily observe that numerous modifications and alterations of the first insulating member may be made while retaining the teachings of the invention. The configuration of the first insulating member is not limited as long as the head portion 311 of the screw 31 is received in the receiving portion thereof to be isolated from the adjacent electronic components when the power transistor 33 is fastened onto the heat sink 36. For example, as shown in FIG. 5(*b*), the bottom surface of the first sleeve of the first insulating member 51 is partially exposed. As shown in FIG. 5(*c*), the top and bottom surfaces of the first sleeve of the first insulating member 52 are partially exposed. As shown in FIGS. 5(*d*) and 5(*e*), the first insulating member 53 further includes a lid 531 coupled to the first sleeve. After the head portion 311 of the screw 31 is received in the receiving portion 532, the lid 531 is closed in order to enhance isolation effect.

Figure 6:
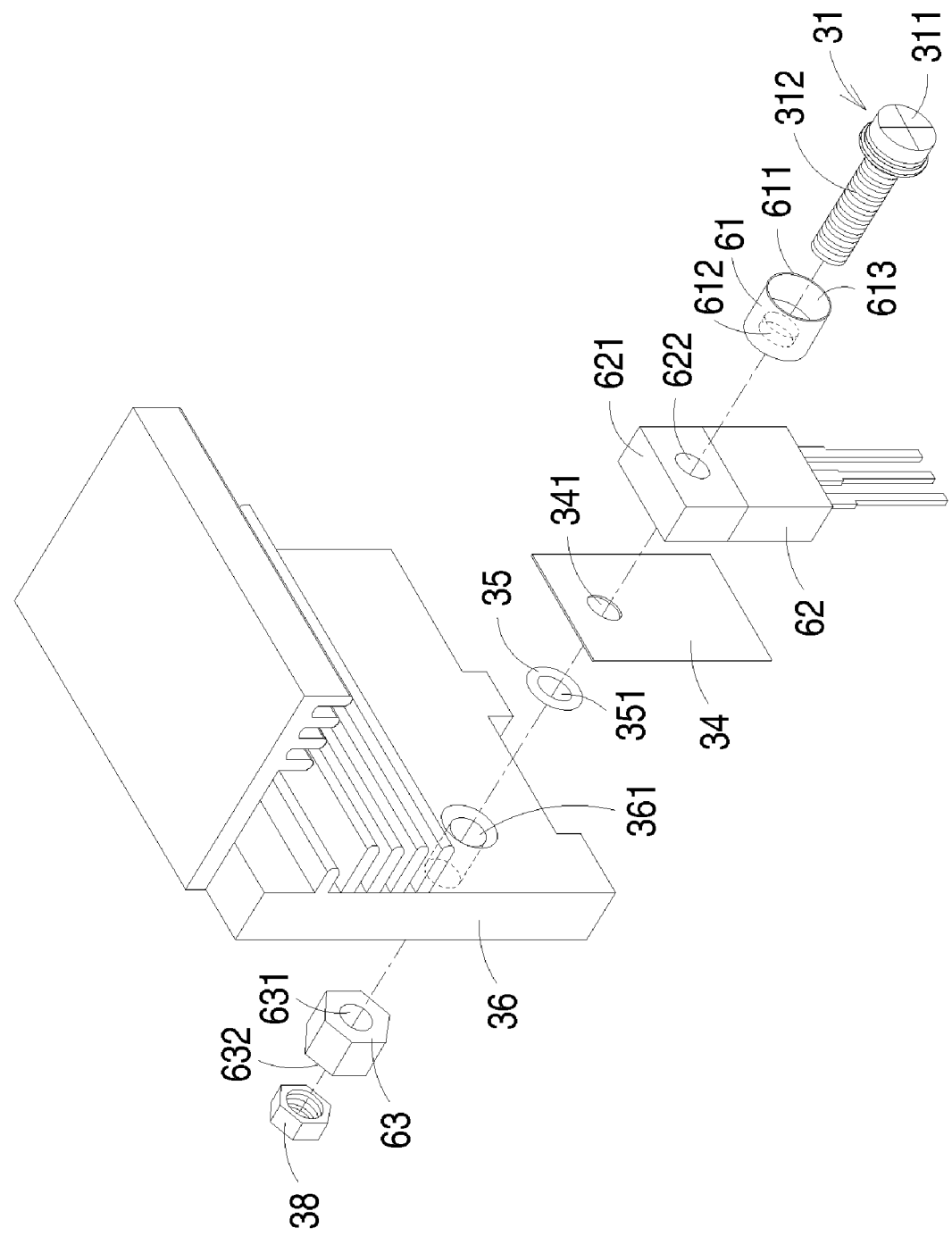
FIG. 6 is a schematic exploded view illustrating a power transistor to be fastened onto a heat sink according to a second preferred embodiment of the present invention.
Figure 7:
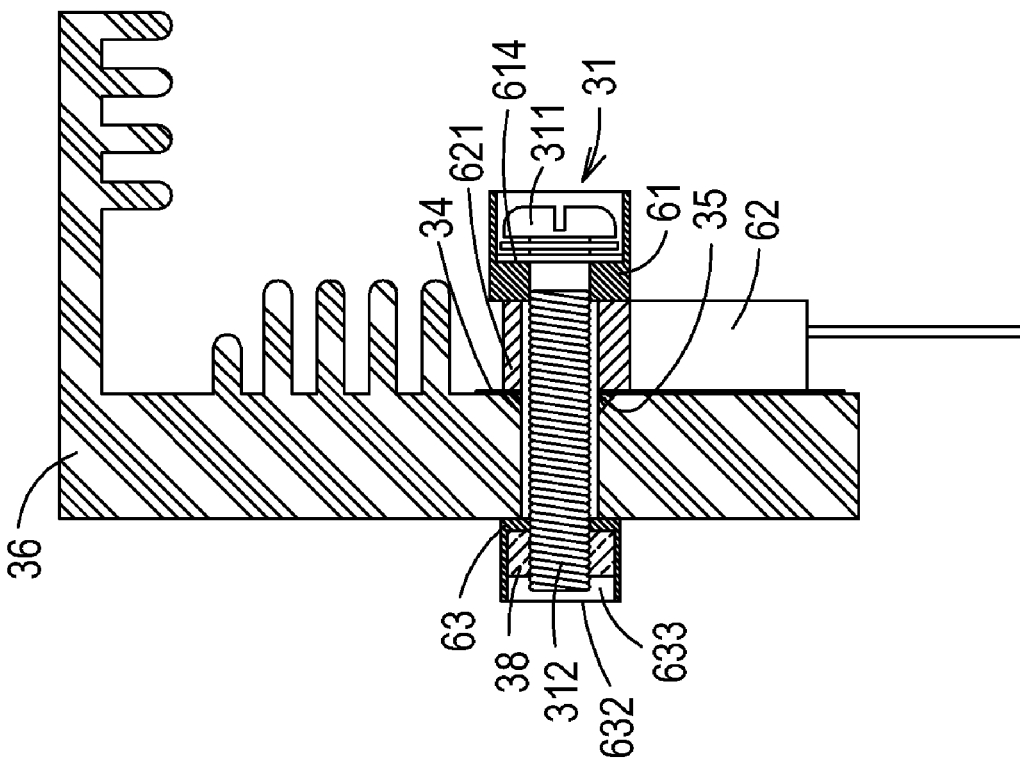
FIG. 7 is a schematic cross-sectional view illustrating the assembled structure of the power transistor and the heat sink shown in FIG. 6.

FIGS. 6 and 7 are schematic exploded and assembled views illustrating an assembled structure of a power transistor and a heat sink according to a second preferred embodiment of the present invention. In this embodiment, the screw 31, the nut 38, the insulating piece 34, the insulating bushing 35 and the heat sink 36 included therein are similar to those shown in FIGS. 3 and 4, and are not redundantly described herein. In addition, the electronic component 62 is a power transistor, which includes an encapsulant resin 621 and a first perforation 622. Since the encapsulant resin 621 is made of insulating material, the encapsulant resin 621 is effective to isolate from the screw 31 and the heat sink 36. Meanwhile, the first insulating member 61 of this embodiment is a sleeve, which includes a first opening 611 and a second opening 612 corresponding to the first perforation 622 of the power transistor 62. The diameter of the first opening 611 is larger than that of the second opening 612. The sleeve 61 further includes a receiving portion 613 between the first opening 611 and the second opening 612, wherein the receiving portion 613 includes an inner bottom surface 614. After the screw 31 is inserted into the sleeve 61, the body portion 312 of the screw 31 is partially penetrated through the second opening 612, and the head portion 311 of the screw 31 is received in the receiving portion 613 of the sleeve 61.

A second insulating member 63 is arranged between the heat sink 36 and the nut 38. In this embodiment, the second insulating member 63 is hexagon-shaped. The second insulating member 63 includes a third opening 631 and a fourth opening 632 corresponding to the through-hole 361 of the heat sink 36 and the nut 38, respectively. The second insulating member 63 further includes a receptacle 633, as is seen in FIGS. 7 and 9(*a*). The diameter of the third opening 631 is smaller than that of the fourth opening 632. The nut 38 is accommodated within the receptacle 633 through the fourth opening 632.

The process of fastening the power transistor 62 onto the heat sink 36 will be illustrated as follows. First of all, the body portion 312 of the screw 31 is successively penetrated through the first opening 611, the receiving portion 613 and the second opening 612 of the first insulating member 61, the first perforation 622 of the power transistor 62, the second perforation 341 of the insulating piece 34, the third perforation 351 of the insulating bushing 35, the through-hole 361 of the heat sink 36 and the third opening 631 of the second insulating member 63. Then, the nut 38 is accommodated within the receptacle 633 through the fourth opening 632 and the body portion 312 of the screw 31 is screwed in the nut 38 such that the power transistor 33 is fastened onto the heat sink 36. Please refer to FIG. 7 again. After the screw 31 is combined with the nut 38, the head portion 311 of the screw 31 is received in the receiving portion 613 of the first insulating member 61 so that the screw 31 is isolated from the adjacent electronic components. Likewise, since the nut 38 is accommodated within the receptacle 633 of the second insulating member 63, the nut 38 is isolated from the adjacent electronic components.

Referring to FIG. 8(*a*), a schematic enlarged view of the first insulating member 61 shown in FIGS. 6 and 7 is illustrated. It is noted that, however, those skilled in the art will readily observe that numerous modifications and alterations of the first insulating member may be made while retaining the teachings of the invention. The configuration of the first insulating member is not limited as long as the head portion 311 of the screw 31 is received in the receiving portion thereof to be isolated from the adjacent electronic components when the power transistor 62 is fastened onto the heat sink 36. For example, as shown in FIG. 8(*b*), the bottom surface of the first insulating member 81 is partially exposed. As shown in FIG. 8(*c*), the top and bottom surfaces of the first insulating member 82 are partially exposed. As shown in FIGS. 8(*d*) and 8(*e*), the first insulating member 83 further includes a lid 831. After the head portion 311 of the screw 31 is received in the receiving portion 832, the lid 831 is closed in order to enhance isolation effect.

Referring to FIG. 9(a), a schematic enlarged view of the second insulating member 63 shown in FIGS. 6 and 7 is illustrated. It is noted that, however, those skilled in the art will readily observe that numerous modifications and alterations of the second insulating member may be made while retaining the teachings of the invention. The configuration of the second insulating member is not limited as long as the nut 38 is accommodated within the receptacle thereof to be isolated from the adjacent electronic components when the power transistor 62 is fastened onto the heat sink 36. For example, as shown in FIG. 9(b), the bottom surface of the second insulating member 91 is partially exposed. As shown in FIG. 9(c), the top and bottom surfaces of the second insulating member 92 are partially exposed. As shown in FIGS. 9(d) and 9(e), the second insulating member 93 further includes a lid 931. After the nut 38 is accommodated within the receptacle 932 of the second insulating member 93, the lid 931 is closed in order to enhance isolation effect.

From the above description, the assembled structure of the present invention is effective to fasten the power semiconductor device onto the heat sink. In addition, since the head portion of the fastening element is received in the receiving portion of the first insulating member, the head portion of the fastening element is isolated from adjacent electronic components and thus the problem of causing short-circuit breakdown is minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembled structure of a power semiconductor device and a heat sink, said assembled structure comprising:
    the power semiconductor device having a first perforation, a first side and a second side adjacent to said first side;
    a first insulating member including a first opening and a second opening corresponding to said first perforation and a sidewall defining a receiving portion between said first opening and said second opening, said receiving portion including an inner bottom surface, wherein said sidewall of said first insulating member is substantially in contact with said first side of said power semiconductor device and protruded relative to said second side of said power semiconductor device;
    a heat sink; and
    a fastening element including a head portion and a body portion, the distance from said first opening to the inner bottom surface of said receiving portion of said first insulating member substantially being not less than the height of said head portion of said fastening element, wherein said body portion is penetrated through said first opening, said receiving portion, said second opening and said first perforation such that said power semiconductor device is fastened onto said heat sink, and said head portion is received in said receiving portion so as to isolate said head portion of said fastening element from adjacent electronic components.

2. The assembled structure according to claim 1 wherein said fastening element is a screw.

3. The assembled structure according to claim 2 wherein said fastening element further includes a nut to be engaged with said body portion of said screw such that said power semiconductor device is fastened onto said heat sink.

4. The assembled structure according to claim 1 further including an insulating piece between said power semiconductor device and said heat sink for isolating said power semiconductor device from said heat sink, wherein said insulating piece includes a second perforation corresponding to said first perforation of said power semiconductor device.

5. The assembled structure according to claim 4 wherein said heat sink has a through-hole corresponding to said second perforation of said insulating piece and said body portion of said screw is penetrated through said through-hole.

6. The assembled structure according to claim 5 further including a second insulating member between said nut and said heat sink for isolating said heat sink from said nut.

7. The assembled structure according to claim 6 wherein said power semiconductor device is a power transistor.

8. The assembled structure according to claim 7 wherein said power semiconductor device includes a metallic plate.

9. The assembled structure according to claim 8 wherein said first insulating member includes a first sleeve and a second sleeve communicated with each other, said first sleeve includes said first opening and said receiving portion, said second sleeve includes said second opening and a channel, said channel is communicated with said receiving portion and said second opening, and the diameter of said first opening is larger than that of said second opening.

10. The assembled structure according to claim 9 wherein said second sleeve of said first insulating member is received in said first perforation of said power semiconductor device, said second perforation of said insulating piece and said through-hole of said heat sink such that said body portion of said screw is isolated from said power semiconductor device and said heat sink.

11. The assembled structure according to claim 10 wherein said second insulating member include a third opening and a fourth opening corresponding to said heat sink and said nut, respectively, and the diameter of said third opening is smaller than that of said fourth opening.

12. The assembled structure according to claim 11 wherein said second insulating member further include a receptacle between said third opening and said fourth opening, wherein said body portion of said screw is successively penetrated through said first opening, said receiving portion, said channel and said second opening of said first insulating member, said first perforation of said power semiconductor device, said second perforation of said insulating piece, said through-hole of said heat sink and said third opening of said second insulating member, and said body portion of said screw is screwed in said nut, wherein said nut is accommodated within said receptacle of said second insulating member so as to isolate said nut from adjacent electronic components.

13. An insulating member for isolating a power semiconductor device from a fastening element, said fastening element includes a head portion and a body portion, said power semiconductor device including a first perforation, a first side and a second side adjacent to said first side, said insulating member comprising a first opening and a second opening corresponding to said first perforation of said power semiconductor device and a sidewall defining a receiving portion between said first opening and said second opening, said receiving portion including an inner bottom surface, the distance from said first opening to the inner bottom surface of said receiving portion of said insulating member substantially being not less than the height of said head portion of said fastening element, wherein said sidewall of said insulating member is substantially in contact with said first side of said power semiconductor device and protruded relative to said second side of said power semiconductor device, and said body portion of said fastening element is penetrated through said first opening, said receiving portion, said second opening and said first perforation such that said power semiconductor device is fastened onto a heat sink, and said head portion is received in said receiving portion so as to isolate said head portion of said fastening element from adjacent electronic components.

14. The insulating member according to claim 13 wherein said insulating member includes a first sleeve and a second sleeve communicated with each other, said first sleeve includes said first opening and said receiving portion, said second sleeve includes said second opening and a channel, said channel is communicated with said receiving portion and said second opening, and the diameter of said first opening is larger than that of said second opening.

15. The insulating member according to claim 14 wherein said second sleeve of said first insulating member is received in said first perforation of said power semiconductor device and a through-hole of said heat sink such that said body portion of said screw is isolated from said power semiconductor device and said heat sink.

* * * * *